US008490418B2

(12) United States Patent
Weber et al.

(10) Patent No.: US 8,490,418 B2
(45) Date of Patent: Jul. 23, 2013

(54) METHOD AND APPARATUS FOR COOLING ELECTRONICS WITH A COOLANT AT A SUBAMBIENT PRESSURE

(75) Inventors: Richard M. Weber, Prosper, TX (US); William G. Wyatt, Plano, TX (US); Kerrin A. Rummel, Richardson, TX (US)

(73) Assignee: Raytheon Company, Waltham, MA (US)

( * ) Notice: Subject to any disclaimer, the term of this patent is extended or adjusted under 35 U.S.C. 154(b) by 105 days.

(21) Appl. No.: 13/043,675

(22) Filed: Mar. 9, 2011

(65) Prior Publication Data

US 2011/0157828 A1 Jun. 30, 2011

Related U.S. Application Data

(62) Division of application No. 11/381,297, filed on May 2, 2006, now Pat. No. 7,908,874.

(51) Int. Cl.
F25B 1/00 (2006.01)

(52) U.S. Cl.
USPC .......................................... 62/115; 62/259.2

(58) Field of Classification Search
USPC ............... 62/259.2, 228.3, 324.2, 323.2, 474; 165/104.21, 104.33; 361/699, 729
See application file for complete search history.

(56) References Cited

U.S. PATENT DOCUMENTS

| 1,528,619 | A | 3/1925 | Alphonse |
| 1,906,422 | A | 5/1933 | Roulton |
| 2,321,964 | A | 6/1943 | Zieber |
| 2,371,443 | A | 3/1945 | Harold |
| 2,991,978 | A | 7/1961 | Jones |
| 3,131,548 | A | 5/1964 | Chubb et al. |
| 3,174,540 | A | 3/1965 | Dutton |
| 3,332,435 | A | 7/1967 | Anderson et al. ............. 137/394 |
| 3,334,684 | A | 8/1967 | Roush et al. .................... 165/47 |
| 3,371,298 | A | 2/1968 | Narbut |

(Continued)

FOREIGN PATENT DOCUMENTS

| DE | GB 1220952 | 3/1968 |
| EP | 0 243 239 A2 | 4/1987 |
| WO | WO 00/65890 | 2/2000 |
| WO | WO 02/23966 | 3/2002 |

(Continued)

OTHER PUBLICATIONS

USPTO; Office Action for U.S. Appl. No. 11/371,681 filed Mar. 8, 2006, in the name of William G. Wyatt; (8 pgs.), Notification Date Dec. 10, 2009.

(Continued)

Primary Examiner — Mohammad M Ali

(57) ABSTRACT

According to one embodiment of the invention, a method is provided for cooling heat-generating structure disposed in an environment having an ambient pressure. The heat-generating structure includes electronics. The method includes providing a coolant, reducing a pressure of the coolant to a subambient pressure at which the coolant has a boiling temperature less than a temperature of the heat-generating structure, and bringing the heat-generating structure and the coolant at the subambient pressure into contact with one another, so that the coolant boils and vaporizes to thereby absorb heat from the heat-generating structure. In a more particular embodiment the coolant is either pure water or pure methanol with an electrical resistivity level of greater than one million Ohms-cm. Further, in another particular embodiment the method includes filtering the coolant to maintain its purity above a particular level.

22 Claims, 3 Drawing Sheets

U.S. PATENT DOCUMENTS

| | | | |
|---|---|---|---|
| 3,524,497 | A | 8/1970 | Chu et al. |
| 3,586,101 | A | 6/1971 | Chu |
| 3,609,991 | A | 10/1971 | Chu et al. |
| 3,731,497 | A | 5/1973 | Ewing .............. 62/160 |
| 3,756,903 | A | 9/1973 | Jones |
| 3,774,677 | A | 11/1973 | Antonetti et al. |
| 3,989,102 | A | 11/1976 | Jaster et al. |
| 4,003,213 | A | 1/1977 | Cox |
| 4,019,098 | A | 4/1977 | McCready et al. |
| 4,072,188 | A | 2/1978 | Wilson et al. .............. 165/80 |
| 4,129,180 | A | 12/1978 | Larinoff |
| 4,169,356 | A | 10/1979 | Kingham |
| 4,295,341 | A | 10/1981 | Gale |
| 4,296,455 | A | 10/1981 | Leaycraft et al. |
| 4,301,861 | A | 11/1981 | Larinoff |
| 4,330,033 | A | 5/1982 | Okada et al. |
| 4,381,817 | A | 5/1983 | Brigida et al. |
| 4,411,756 | A | 10/1983 | Bennett et al. |
| 4,495,988 | A | 1/1985 | Grossman |
| 4,511,376 | A | 4/1985 | Coury |
| 4,585,054 | A | 4/1986 | Köprunner |
| 4,638,642 | A | 1/1987 | Tokuno |
| 4,691,532 | A | 9/1987 | Reid et al. .............. 62/476 |
| 4,794,984 | A | 1/1989 | Lin |
| 4,843,837 | A | 7/1989 | Ogawa et al. .............. 62/324.1 |
| 4,851,856 | A | 7/1989 | Altoz |
| 4,897,762 | A * | 1/1990 | Daikoku et al. .............. 361/689 |
| 4,938,280 | A | 7/1990 | Clark |
| 4,945,980 | A | 8/1990 | Umezawa |
| 4,998,181 | A | 3/1991 | Haws et al. |
| 5,021,924 | A | 6/1991 | Kieda et al. |
| 5,067,560 | A | 11/1991 | Carey et al. |
| 5,086,829 | A | 2/1992 | Asakawa |
| 5,128,689 | A | 7/1992 | Wong et al. |
| 5,148,859 | A | 9/1992 | Beamer |
| 5,158,136 | A | 10/1992 | Azar |
| 5,161,610 | A | 11/1992 | Leidinger |
| 5,168,919 | A | 12/1992 | Berenholz et al. |
| 5,181,395 | A | 1/1993 | Carpenter et al. |
| 5,183,104 | A | 2/1993 | Novotny |
| 5,239,443 | A | 8/1993 | Fahey et al. |
| 5,245,839 | A | 9/1993 | Chang et al. |
| 5,261,246 | A | 11/1993 | Blackmon et al. |
| 5,333,677 | A | 8/1994 | Mclivadas |
| 5,349,499 | A * | 9/1994 | Yamada et al. .............. 361/700 |
| 5,353,865 | A | 10/1994 | Adiutori et al. |
| 5,398,519 | A | 3/1995 | Weber et al. .............. 62/201 |
| 5,406,807 | A | 4/1995 | Ashiwake et al. .............. 62/376 |
| 5,447,189 | A | 9/1995 | McIntyre |
| 5,464,325 | A | 11/1995 | Albring et al. |
| 5,493,305 | A | 2/1996 | Wooldridge et al. |
| 5,497,631 | A | 3/1996 | Lorentzen et al. |
| 5,501,082 | A | 3/1996 | Tachibana et al. |
| 5,509,468 | A | 4/1996 | Lopez .............. 165/144 |
| 5,515,690 | A | 5/1996 | Blackmon et al. |
| 5,522,452 | A * | 6/1996 | Mizuno et al. .............. 165/286 |
| 5,544,012 | A * | 8/1996 | Koike .............. 361/695 |
| 5,605,054 | A | 2/1997 | Chen |
| 5,655,600 | A | 8/1997 | Dewar et al. |
| 5,666,269 | A | 9/1997 | Romero et al. |
| 5,677,847 | A * | 10/1997 | Walling .............. 716/129 |
| 5,701,751 | A | 12/1997 | Flores |
| 5,761,037 | A | 6/1998 | Anderson et al. |
| 5,815,370 | A | 9/1998 | Sutton |
| 5,818,692 | A | 10/1998 | Denney, Jr. et al. |
| 5,829,514 | A | 11/1998 | Smith et al. |
| 5,841,564 | A | 11/1998 | McDunn et al. |
| 5,862,675 | A | 1/1999 | Scaringe et al. |
| 5,868,999 | A * | 2/1999 | Karlson .............. 422/30 |
| 5,910,160 | A | 6/1999 | Caakmakci et al. |
| 5,940,270 | A | 8/1999 | Puckett .............. 361/699 |
| 5,943,211 | A | 8/1999 | Havey et al. |
| 5,950,717 | A | 9/1999 | Fay |
| 5,960,861 | A | 10/1999 | Price et al. |
| 6,018,192 | A | 1/2000 | Root et al. |
| 6,037,658 | A * | 3/2000 | Brodsky et al. .............. 257/707 |
| 6,038,873 | A | 3/2000 | Koo .............. 62/196.4 |
| 6,052,284 | A | 4/2000 | Suga et al. |
| 6,052,285 | A | 4/2000 | Hileman .............. 361/699 |
| 6,055,154 | A | 4/2000 | Azar |
| 6,173,758 | B1 | 1/2001 | Ward et al. |
| 6,205,803 | B1 | 3/2001 | Scaringe .............. 62/259.2 |
| 6,292,364 | B1 | 9/2001 | Fitzgerald et al. |
| 6,297,775 | B1 | 10/2001 | Haws et al. |
| 6,305,463 | B1 | 10/2001 | Salmonson |
| 6,347,531 | B1 | 2/2002 | Roberts et al. |
| 6,349,760 | B1 | 2/2002 | Budelman |
| 6,366,462 | B1 | 4/2002 | Chu et al. |
| 6,397,932 | B1 | 6/2002 | Calaman et al. |
| 6,415,619 | B1 | 7/2002 | Bash |
| 6,498,725 | B2 | 12/2002 | Cole et al. |
| 6,519,955 | B2 | 2/2003 | Marsala |
| 6,529,377 | B1 | 3/2003 | Nelson et al. |
| 6,536,516 | B2 | 3/2003 | Davies et al. |
| 6,571,569 | B1 | 6/2003 | Rini et al. .............. 62/259.2 |
| 6,594,479 | B2 | 7/2003 | Ammar et al. |
| 6,603,662 | B1 | 8/2003 | Ganrot |
| 6,625,023 | B1 | 9/2003 | Morrow et al. .............. 361/700 |
| 6,679,081 | B2 | 1/2004 | Marsala |
| 6,687,122 | B2 | 2/2004 | Monfarad .............. 361/687 |
| 6,708,511 | B2 | 3/2004 | Martin |
| 6,729,383 | B1 | 5/2004 | Cannell et al. |
| 6,827,135 | B1 | 12/2004 | Kramer et al. |
| 6,828,675 | B2 | 12/2004 | Memory et al. .............. 257/714 |
| 6,950,303 | B2 * | 9/2005 | Neho et al. .............. 361/679.08 |
| 6,952,345 | B2 | 10/2005 | Weber et al. |
| 6,952,346 | B2 | 10/2005 | Tilton et al. |
| 6,957,550 | B2 | 10/2005 | Wyatt et al. |
| 6,976,527 | B2 | 12/2005 | Kirshberg et al. |
| 6,993,926 | B2 | 2/2006 | Rini et al. .............. 62/259.2 |
| 7,000,691 | B1 | 2/2006 | Weber |
| 7,017,358 | B2 | 3/2006 | Wayburn et al. .............. 62/115 |
| 7,110,260 | B2 | 9/2006 | Weber et al. .............. 361/700 |
| 7,227,753 | B2 | 6/2007 | Weber et al. .............. 361/700 |
| 7,240,494 | B2 | 7/2007 | Akei et al. .............. 62/3.2 |
| 7,246,658 | B2 | 7/2007 | Wyatt et al. .............. 165/274 |
| 7,254,957 | B2 | 8/2007 | Weber et al. |
| 7,402,029 | B2 * | 7/2008 | Munch et al. .............. 417/474 |
| 7,414,843 | B2 | 8/2008 | Joshi et al. .............. 361/699 |
| 7,449,226 | B2 * | 11/2008 | Matsumura et al. .............. 428/66.6 |
| 7,508,081 | B2 * | 3/2009 | Matsumura et al. .............. 257/782 |
| 7,607,475 | B2 | 10/2009 | Weber .............. 165/281 |
| 2002/0124585 | A1 | 9/2002 | Bash et al. .............. 62/228.4 |
| 2003/0042003 | A1 | 3/2003 | Novotny et al. .............. 165/47 |
| 2003/0053298 | A1 | 3/2003 | Yamada et al. |
| 2003/0062149 | A1 | 4/2003 | Goodson et al. |
| 2004/0040328 | A1 * | 3/2004 | Patel et al. .............. 62/259.2 |
| 2004/0231351 | A1 | 11/2004 | Wyatt |
| 2005/0262861 | A1 | 12/2005 | Weber et al. |
| 2006/0021736 | A1 | 2/2006 | Tran |
| 2008/0158817 | A1 | 7/2008 | Tsunoda et al. .............. 361/697 |
| 2008/0291629 | A1 | 11/2008 | Ali .............. 361/700 |

FOREIGN PATENT DOCUMENTS

| | | |
|---|---|---|
| EP | 02 51 836 A1 | 5/1987 |
| EP | 0 817 263 A2 | 10/1991 |
| EP | 0 666 214 A1 | 8/1995 |
| EP | 1 143 778 A1 | 10/2001 |
| EP | 1 380 799 A2 | 1/2004 |
| EP | 1 381 083 A2 | 1/2004 |
| EP | 1 601 043 A2 | 11/2005 |
| EP | 1 627 192 B1 | 1/2008 |
| FR | 2 730 556 A1 | 2/1995 |
| JP | 60-229353 | 11/1985 |
| JP | 04-044352 | 2/1992 |
| JP | 4-316972 | 9/1992 |
| JP | 11-163571 | 6/1999 |
| JP | 11-330330 | 11/1999 |
| JP | 2002-221398 | 8/2002 |
| JP | 2003-318342 | 11/2003 |
| JP | 2004-190928 | 7/2004 |
| JP | 2006-051477 | 2/2006 |

OTHER PUBLICATIONS

USPTO;Office Action for U.S. Appl. No. 11/371,681 filed Mar. 8, 2006, in the name of William G. Wyatt; (8 pgs.), Notification Date Aug. 5, 2009.

USPTO;Office Action for U.S. Appl. No. 11/371,681 filed Mar. 8, 2006, in the name of William G. Wyatt; (7 pgs.), Notification Date Jun. 8, 2010.
USPTO; Office Action for U.S. Appl. No. 11/859,591 filed Sep. 21, 2007, in the name of William G. Wyatt; (13 pgs.), Notification Date Aug. 3, 2009.
USPTO; Final Office Action for U.S. Appl. No. 11/859,591 filed Sep. 21, 2007, in the name of William G. Wyatt; (13 pgs.), Notification Date Feb. 18, 2010.
USPTO; Notice of Allowance and Fee(s) Due for U.S. Appl. No. 11/859,591 filed Sep. 21, 2007, in the name of William G. Wyatt; (4 pgs.), Date Mailed Jul. 8, 2010.
USPTO; Notice of Allowance and Fee(s) Due for U.S. Appl. No. 10/192,891 filed Jul. 11, 2002, in the name of Richard M. Weber; (6 pgs.), Date Mailed Sep. 12, 2005.
USPTO; Office Action for U.S. Appl. No. 10/192,891 filed Jul. 11, 2002, in the name of Richard M. Weber; (6 pgs.), Date Mailed Jan. 12, 2005.
USPTO; Office Action for U.S. Appl. No. 10/192,891 filed Jul. 11, 2002, in the name of Richard M. Weber; (5 pgs.), Date Mailed Mar. 4, 2004.
USPTO; Office Action for U.S. Appl. No. 10/192,891 filed Jul. 11, 2002, in the name of Richard M. Weber; (4 pgs.), Date Mailed Sep. 30, 2003.
USPTO; Notice of Allowance and Fee(s) Due for U.S. Appl. No. 10/193,571 filed Jul. 11, 2002, in the name of James L. Haws; (4 pgs.), Date Mailed Jun. 6, 2005.
USPTO; Office Action for U.S. Appl. No. 10/193,571 filed Jul. 11, 2002, in the name of James L. Haws; (7 pgs.), Date Mailed Feb. 1, 2005.
USPTO; Notice of Allowance and Fee(s) Due for U.S. Appl. No. 10/193,571 filed Jul. 11, 2002, in the name of James L. Haws;(4 pgs.), Date Mailed May 21, 2004.
USPTO; Final Office Action for U.S. Appl. No. 10/193,571 filed Jul. 11, 2002, in the name of James L. Haws; (8 pgs.), Date Mailed Mar. 3, 2004.
USPTO; Office Action for U.S. Appl. No. 10/193,571 filed Jul. 11, 2002, in the name of James L. Haws; (6 pgs.), Date Mailed Oct. 20, 2003.
USPTO; Notice of Allowance and Fee(s) Due for U.S. Appl. No. 10/440,716 filed May 19, 2003, in the name of William Gerald Wyatt; (6 pgs.), Date Mailed Jun. 1, 2005.
USPTO; Final Office Action for U.S. Appl. No. 10/440,716 filed May 19, 2003, in the name of William Gerald Wyatt; (6 pgs.), Date Mailed Mar. 3, 2005.
USPTO; Office Action for U.S. Appl. No. 10/440,716 filed May 19, 2003, in the name of William Gerald Wyatt; (5 pgs.), Date Mailed Oct. 22, 2004.
USPTO; Office Action for U.S. Appl. No. 10/440,716 filed May 19, 2003, in the name of William Gerald Wyatt; (9 pgs.), Date Mailed Jun. 10, 2004.
USPTO; Notice of Allowance and Fee(s) Due for U.S. Appl. No. 11/058,691 filed Feb. 15, 2005, in the name of Richard Martin Weber; (5 pgs.), Date Mailed Apr. 9, 2007.
USPTO; Office Action for U.S. Appl. No. 11/058,691 filed Feb. 15, 2005, in the name of Richard Martin Weber; (5 pgs.), Notification Date Jan. 2, 2007.
USPTO; Office Action for U.S. Appl. No. 11/154,107 filed Jun. 15, 2005, in the name of Richard M. Weber; (6 pgs.), Date Mailed Dec. 23, 2005.
USPTO; Notice of Allowance and Fee(s) Due for U.S. Appl. No. 11/154,107 filed Jun. 15, 2005, in the name of Richard M. Weber; (5 pgs.), Date Mailed May 17, 2006.
USPTO; Notice of Allowance and Fee(s) Due for U.S. Appl. No. 11/533,219 filed Sep. 19, 2006, in the name of Richard M. Weber; (8 pgs.), Date Mailed Jan. 31, 2007.
USPTO; Office Action, for U.S. Appl. No. 10/867,331 filed Jun. 14, 2004, in the name of William G. Wyatt, (10 pgs.), Notification Date Jan. 19, 2010.
USPTO; Final Office Action, for U.S. Appl. No. 10/867,331, filed Jun. 14, 2004, in the name of William G. Wyatt, (11 pgs.), Notification Date May 17, 2010.

USPTO; Office Action, U.S. Appl. No. 11/339,241, filed Jan. 24, 2006, in the name of Richard M. Weber, (10 pgs), Notification Date Oct. 9, 2007.
USPTO; Notice of Allowance and Fees Due, U.S. Appl. No. 11/339,241, filed Jan. 24, 2006, in the name of Richard M. Weber, (7 pgs), Notification Date Jun. 15, 2009.
European Patent Office; Communication Pursuant to Article 94(3) EPC for Application No. 07 755 199.2-2301; Ref. JL 55728P EPP (4 pages), Jun. 10, 2010.
"Heating, Ventilating, and Air-Conditioning Applications", 1999 Ashrae Handbook, Atlanta, SI Edition, Chapter 47—Water Treatment, http://ww.ashrae.org, pp. 47.1-47.11 (12 pgs), 1999.
European Search Report for International Application No. PCT/US2007/008842; 9 pages, Oct. 5, 2007.
Margaret Ingels, (pp. 59 and 80 of Willis Haviland Carrier "Father of Air Conditioning", Country Life Press—Garden City (1952).
Dirk Van Orshoven, "The use of water as a refrigerant—an exploratory investigation", Thesis University Wisconsin, 1991, pp. I, III-XIII, 1-114.
"An Integrated Thermal Architecture for Thermal Management of High Power Electronics", High Power Electronics, http:www.coolingzone.com/Guest/News/NL_JAN_2003/Thermacore/ Thermacore Jan. 2003, 22 pages.
Beaty, et al., "New Guidelines for Data Center Cooling", Dec. 2003; 8 pages.
Wilson, et al., "A Thermal Bus System for Cooling Electronic Components in High-Density Cabinets", 2004 AHSRAE Transactions; Symposia, pp. 567-573.
Center for the Analysis and Dissemination of Demonstrated Energy Technology (CADDET), Cooling plant at LEGO uses water as refrigerant, Sep. 1997.
Muller, Norbert, Ph.D. Turbo Chillers using Water as a Refrigerant, Michigan State University, AMSE Process Industry Division PID Newsletter, Fall 2002, p. 3.
Maab, Jurgen and Feddeck, Paul, BINE Projectinfo, BINE Informationsdienst, Wasser als Kaltemittel, Aug. 2003.
Kharzi, A., Ph.D., Preliminary Study of a Novel R718 Turbo-Compression Cycle using a 3-port condensing wave rotor, 2004 International ASME Turbo Exposition, ASME Paper GT2004-53622, Austria, Jun. 2004.
"Subcooled Flow Boiling With Flow Pattern Control" IBM Technical Disclosure Bulletin, vol. 22, Issue 5, pp. 1843-1844 Oct. 1, 1979.
U.S. Appl. No. 10/193,571, filed Jul. 11, 2002, entitled "Method and Apparatus for Removing Heat from a Circuit", 33 pages of text and 3 pages of drawings.
U.S. Appl. No. 10/192,891, filed Jul. 11, 2002 by inventor Richard M. Weber for "Method and Apparatus for Cooling with Coolant at a Subambient Pressure", 21 pages of text and 2 pages of drawings.
U.S. Appl. No. 10/440,716, filed May 19, 2003 by inventors William Gerald Wyatt and Richard M. Weber for "Method and Apparatus for Extracting Non-Condensable Gases in a Cooling System", 21 pages of text and 1 drawing sheet.
U.S. Appl. No. 10/853,038, filed May 25, 2004 by inventors Richard M. Weber, et al. for "Method and Apparatus for Controlling Cooling with Coolant at a Subambient Pressure" 25 pages of text and 4 drawing sheets.
U.S. Appl. No. 11/058,691, filed Feb. 15, 2005 by inventors Weber, et al., "Method and Apparatus for Cooling with Coolant at a Subambient Pressure", 28 pages.
PCT Notification of Transmittal of The International Search Report or the Declaration dated Sep. 27, 2004 for PCT/US2004/015086.
EPO Search Report dated Oct. 25, 2004 for Patent No. 03254283.9-2203; Reference No. JL3846.
EPO Search Report dated Nov. 3, 2004 for Patent No. 03254285.4-2301; Reference No. JL3847.
EP Search Report dated May 4, 2005 for European Patent Application No. EP 04256509.3.
EP Search Report dated Mar. 4, 2005 for European Patent Application No. EP 04256509.3-2220.
Notification of Transmittal of the International Search Report and the Written Opinion of the International Searching Authority or the Declaration Int'l Application No. PCT/US2005/1020544; date of mailing: Oct. 10, 2005; Int'l filing date Jun. 10, 2005; 3 pages.

"International Search Report", Int'l Application No. PCT/US2005/020544; Earliest Priority Date: Jun. 14, 2004; Int'l filing date: Jun. 10, 2005; 5 pages.

"Written Opinion of the International Searching Authority," Int'l Application No. PCT/US2005/020544; Earliest Priority Date: Jun. 14, 2004; Int'l filing date: Jun. 10, 2005; International Patent Classification: F25B43/04; 9 pages.

Notification of Transmittal of The International Search Report and The Written Opinion of the International Searching Authority, or the Declaration; PCT/US2007/004146; dated Jul. 31, 2007; 6 pages.

Application Bulletin #16; "Water Purity Requirements in Liquid Cooling Systems;" Jun. 12, 1995; 4 pages.

Kharazi, et al., "Implementation of 3-Port Condensing Wave Rotors in R718 Cycles", Journal of Energy Resources Technology, Dec. 2006, vol. 128, pp. 325-334.

Karazi, et al. "An Application of Wave Rotor Technology for Performance Enhancement of R718 Refrigeration Cycles", The American Institute of Aeronautics and Astronautics, Inc., pp. 965-977.

Kharazi, et al., "Performance Benefits of R718 Turbo-Compression Cycle Using 3-Port Condensing Wave Rotors", Proceedings of IMECE04; 2004 ASME International Mechanical Engineering Congress and Exposition, Nov. 13-20, 2004, pp. 167-176.

Kharazi, et al., "Preliminary Study of a Novel R718 Turbo-Compression Cycle Using a 3-Port Condensing Wave Rotor", Proceedings of ASME Turbo Expo. 2004, Jun. 14-17, 2004.

Kharazi, et al., "Preliminary Study of a Novel R718 Compression Refrigeration Cycle Using a Three-Port Condensing Wave Rotor", Journal of Engineering for Gas Turbines and Power, Jul. 2005, vol. 127, pp. 539-544.

Akbari, et al., "A Review of Wave Rotor Technology and Its Applications", Proceedings of IMEC04, 2004 ASME International Mechanical Engineering Congress and Exposition, Nov. 13-20, 2004, IMECE2004-60082, pp. 81-103.

Kilicarslan, et al., "A comparative study of water as a refrigerant with some current refrigerants", International Journal of Energy Research, pp. 948-959, 2005.

Akbari, et al., "Utilizing Wave Rotor Technology to Enhance the Turbo Compression in Power and Refrigeration Cycles", Proceedings of IMECE'03, 2003 ASME International Mechanical Engineering, Nov. 16-21, 2003.

European Patent Office Communication, dated Mar. 20, 2008, Reference JL36895P.EPP, 6 pages, Mar. 20, 2008.

Japanese Office Action dated Jan. 29, 2013 in connection with Japanese Application No. 2009-509578, 8 pages.

* cited by examiner

METHOD AND APPARATUS FOR COOLING ELECTRONICS WITH A COOLANT AT A SUBAMBIENT PRESSURE

RELATED APPLICATIONS

This application is a divisional of application Ser. No. 11/381,297, filed May 2, 2006, entitled "Method and Apparatus for Cooling Electronics with a Coolant at a Subambient Pressure," now U.S. Pat. No. 7,908,874.

TECHNICAL FIELD OF THE INVENTION

This invention relates in general to cooling techniques and, more particularly, to a method and apparatus for cooling electronics with a coolant at a subambient pressure.

BACKGROUND OF THE INVENTION

Some types of electronic circuits use relatively little power, and produce little heat. Circuits of this type can usually be cooled satisfactorily through a passive approach, such as convection cooling. In contrast, there are other circuits which consume large amounts of power, and produce large amounts of heat. One example is the circuitry used in a phased array antenna system. Others include other types of electronics, such as densely packed electronics used for current and future computational circuits, which can produce 1000-10,000 watts of heat per cubic centimeter, or more.

In the modern phased array antenna example, the system can easily produce 25 to 500 kilowatts of heat, or even more. Future computers are envisioned to produce equally large amounts of heat. One known approach for cooling this circuitry is to incorporate a refrigeration unit into the electronics cooling. However, suitable refrigeration units are large, heavy, and consume many kilowatts of power in order to provide adequate cooling. Although refrigeration units of this type have been generally adequate for their intended purposes, they have not been satisfactory in all respects. An equally important factor is the inability of existing methods to remove high flux heat loads from electronic components and modules. Existing approaches, which use a coolant flowing inside a coldplate or thermal plane to which electrical components and modules are mounted, have inadequate heat transfer performance to meet future needs. In addition, approaches using two-phase, sprayed fluorinerts are not satisfactory in all respects.

SUMMARY OF THE INVENTION

According to one embodiment of the invention, a method is provided for cooling heat-generating structure disposed in an environment having an ambient pressure. The heat-generating structure includes electronics. The method includes providing a coolant, reducing a pressure of the coolant to a subambient pressure at which the coolant has a boiling temperature less than a temperature of the heat-generating structure, and bringing the heat-generating structure and the coolant at the subambient pressure into contact with one another, so that the coolant boils and vaporizes to thereby absorb heat from the heat-generating structure. In a more particular embodiment the coolant is either pure water or pure methanol with an electrical resistivity level of greater than one million Ohms-cm. Further, in another particular embodiment the method includes filtering the coolant to maintain its purity above a particular level.

Some embodiments of the invention may provide numerous technical advantages. Other embodiments may realize some, none, or all of these advantages. For example, according to one embodiment, large amounts of heat may be removed from a heat-generating structure, allowing, for example, more densely-packed electronics to be utilized.

Other advantages may be readily ascertainable by those skilled in the art.

BRIEF DESCRIPTION OF THE DRAWINGS

A more complete understanding of embodiments of the invention will be apparent from the detailed description taken in conjunction with the accompanying drawings in which.

DETAILED DESCRIPTION OF EXAMPLE EMBODIMENTS OF THE INVENTION

Example embodiments of the present invention and their advantages are best understood by referring to FIGS. 1A-4B of the drawings, like numerals being used for like and corresponding parts of the various drawings.

Figure 1A:
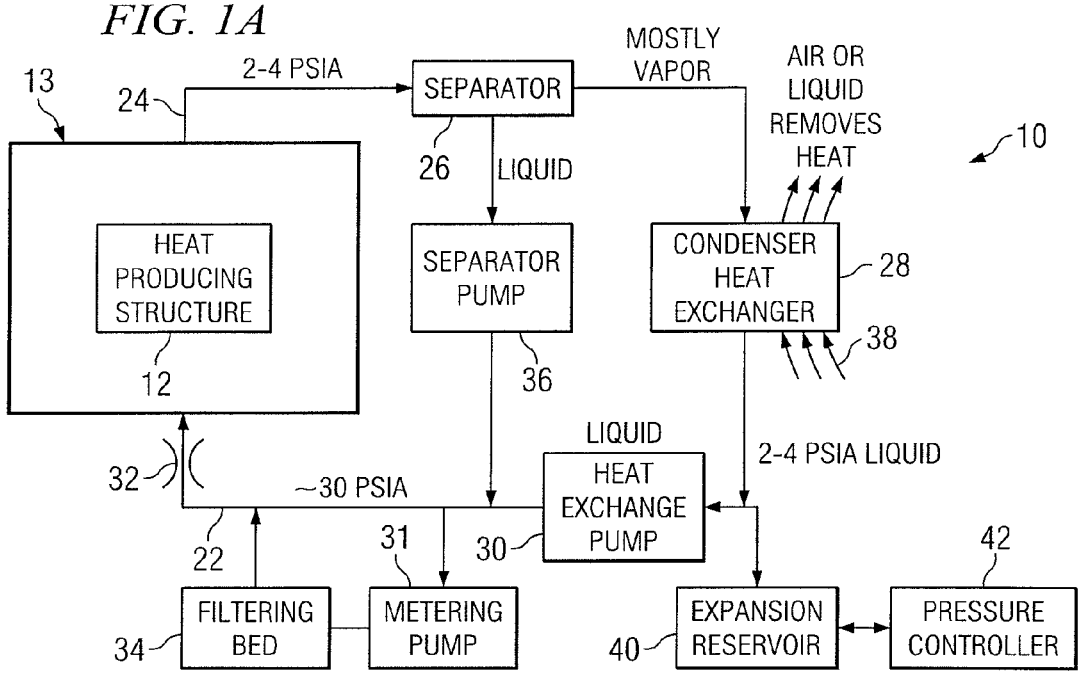
FIG. 1A is a block diagram of an apparatus which includes a heat-generating structure and an associated cooling arrangement that embodies aspects of the present invention.
Figure 1B:
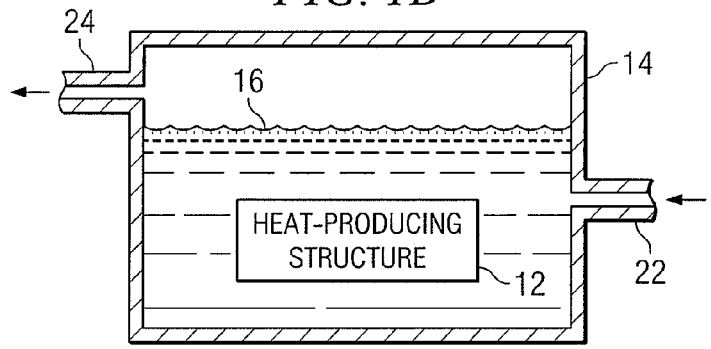
FIG. 1B is a side view of one example of the chamber and heat producing structure of the system of FIG. 1A.

FIG. 1A is a block diagram of an apparatus 10 that includes a heat-generating structure 12. The heat-generating structure 12 may be, in a particular embodiment, one or more microelectronic assemblies, which may produce an enormous amount of heat that is difficult to cool using conventional techniques. Alternatively, heat-generating structures may include no electronics and/or may not produce excessive amounts of heat. In general, although the teachings of the invention may provide greater benefit to cooling microelectronics that produce excessive amounts of heat, these teachings are applicable to cooling any type of device at high or lower levels of heat-generation. According to the teachings of one embodiment of the invention, heat-generating structure 12 is submerged within a bath of coolant 16 within a chamber 14 and/or subject to a flow of coolant 16 with coolant 16 being at a subambient pressure. One example is illustrated in FIG. 1B. The bath may be a generally stationary bath or, alternatively, the bath may further utilize flowing coolant 16 to further enhance heat transfer from heat-generating structure 12 to coolant 16. Alternatively, the bath may be replaced with simply a flow of coolant over heat-generating structure 12.

Coolant 16 may be any liquid with suitable resistivity and latent heat of vaporization properties. In the environment in which microelectronics is used within heat-generating structure 12, the resistivity of coolant 16 should be high enough such that coolant 16 does not form a short in the microelectronics. Further, where large heat loads need to be disposed of, liquids with relatively high latent heats of vaporization are more desirable. Both pure water and methanol meet these criteria when high heat load microelectronics are used as part of heat-generating structure 12.

Pure water has a very high electrical resistivity of approximately 18.2 million Ohms-cm and pure methanol has a high electrical resistivity of approximately 40 million Ohms-cm. Consequently, such pure water or pure methanol would not cause electrical shorts in heat-generating structure 12 in the associated electrical signals or power leads. Use of pure water as coolant 16 is particularly desirable because of its relatively high latent heat of vaporization, which is about 24 times that of fluroinerts. Methanol also has a fairly high latent heat vaporization, about half of that of water. However, although pure water and methanol are particularly desirable coolants, other coolants may also be used.

System 10 is designed such that coolant 16 boils when it comes into contact with heat-generating structure 12. In particular, system 10 involves reducing the pressure of coolant 16 to subambient levels such that it boils at a desired temperature lower than the temperature at which the coolant 16 would otherwise boil. Thus system 10 may be referred to as a subambient cooling system. Subambient cooling systems suitable for use with the present disclosure include those described in the following patent applications assigned to the same assignee as the present invention: Method and Apparatus for Cooling with Coolant at a Subambient Pressure, filed Jul. 11, 2002, having a Ser. No. 10/192,891; and Method and Apparatus for Controlling Cooling with Coolant at a Subambient Pressure, filed May 25, 2004, having a Ser. No. 10/853, 038, which are both incorporated herein by reference for all purposes.

Providing coolant 16 at subambient levels permits the use of pure water and methanol as coolants, which are typically not useful in certain applications because of their relatively high boiling temperatures. Thus, the teachings of the invention recognize the desirability of combining boiling heat transfer at a subambient pressure, which is generally the best heat removal mechanism to extract heat from a surface, with direct application of the coolant to the heat-generating structure, such as by submerging or flowing the coolant over the structure. When used with electronic components as part of heat-generating structure 12, submersion of heat-generating structure 12, or sufficient flow of coolant 16 over heat-generating structure 12, allows heat to be removed from active and passive component surfaces and features, as well as removing heat from component leads. Additional details of system 10 are described below with reference to FIGS. 1A-4B.

Heat-generating structure 12 is configured so that the heat it generates is transferred to coolant 16 coming into contact with heat-generating structure 16. Coolant flows through a tube 22. As discussed later, this fluid coolant is a two-phase coolant 16, which comes into contact with heat-generating structure 12 in liquid form. Absorption of heat from heat-generating structure 12 causes part or all of the liquid coolant 16 to boil and vaporize, such that some or all of the coolant 16 flowing through a tube 24 is in its vapor phase. This departing coolant 16 then flows successively through a separator 26, a heat exchanger 28, a pump 30, a metering pump 31, and a filtration bed 34 in order to again reach the inlet end of tube 22. As illustrated, only a portion of coolant 16 flows through metering pump 31 and filtration bed 34.

Pump 30 causes coolant 16 to circulate around the endless loop shown in FIG. 1. In the embodiment of FIG. 1, the pump 30 consumes only about 0.1 kilowatts to 2.0 kilowatts of power.

Separator 26 separates the vaporized portion of the liquid coolant 16 flowing through tube 24 from the unvaporized liquid portion. The vaporized portion is provided to heat exchanger 28, and the liquid portion is provided at separator pump 36. Separator pump 36 receives the liquid portion of the coolant that has not vaporized in tube 24 and circulates this fluid back through tube 22. Orifice 32 creates a pressure drop between throughput of pump 30 and the output of 32, where coolant 16 vaporizes.

As described above, the teachings of the invention recognize that in some instances it will be desirable to purify coolant 16 while it flows in the above-described loop to maintain its resistivity above a desired level. This is particularly true when coolant 16 is pure water and heat-generating structure 16 comprises electronic components. The particular desired level of resistivity will vary based on the structure and content of heat-generating structure 16, but in one example, maintaining the resistivity of coolant 16 above one million Ohms-cm is particularly desirable for avoiding electrical shorts. Filtration bed 34 is used to remove contaminants from coolant 16 such as salts, metallic constituents, or other contaminants that are generated or that enter the loop during operation, to ensure it has a resistivity sufficiently high enough during operation that it does not cause electrical shorts in heat-generating structure 12. Filtration bed 34 may remove carbon dioxide, free oxygen and metallics, and may utilize a distillation, reverse osmosis, or other suitable process. Only about 5-100 of the coolant flow would need to be processed, in one embodiment, which is provided by metering pump 31. Other purification methods may also be used.

Ambient air or liquid 38 is caused to flow through heat exchanger 28, for example, by a not-illustrated fan of a known type. Alternatively, if the apparatus 10 was on a ship, the flow 38 could be ambient seawater or a distilled water secondary loop that transfers heat to seawater. The heat exchanger 28 transfers heat from the coolant to the air flow 38. The heat exchanger 28 thus cools the coolant, thereby causing any portion of the coolant which is in the vapor phase to condense back into its liquid phase.

Liquid coolant 16 exiting heat exchanger 28 is supplied to expansion reservoir 40. Since fluids typically take up more volume in their vapor phase than in their liquid phase, expansion reservoir 40 is provided in order to take up the volume of liquid coolant that is displaced when some or all of the coolant in the system changes from its liquid phase to its vapor phase. The amount of coolant 16 that is in its vapor phase can vary over time, due in part to the fact that the amount of heat being produced by heat-generating structure 16 will vary over time, as the heat-generating structure 16 may operate in various operational modes over time, in some embodiments.

In some embodiments, a controller may be utilized to control the amount of heat transfer from heat-generating structure 16, one example of which is desired in Method and Apparatus for Controlling Cooling with Coolant at a Subambient Pressure, filed May 25, 2004, having a Ser. No. 10/853, 038, which is incorporated herein by reference. However, other control approaches may be used. In one particular embodiment, a pressure controller 42 maintains coolant 16 at a desired subambient pressure in portions of the cooling loop downstream of filtration bed 34 and upstream of pump 30. Typically, the ambient air pressure will be that of atmospheric air, which at sea level is 14.7 pounds per square inch absolute (psia). When heat-generating structure 12 undergoes transient heat loads, this subambient pressure may need to be adjusted to allow greater or lesser amounts of heat transfer from heat-generating structure 12 at a desired temperature. Heat-generating structure 12 is maintained at a desired temperature by feeding back the pressure of the coolant as it exits tube 22. This pressure is indicative of the temperature of the boiling coolant. In response, pressure controller 42 may respond by raising or lowering the pressure of coolant 16, which affects the boiling temperature of the coolant. By feeding back the coolant pressure, as opposed to the temperature of heat-generating structure 12, associated thermal delay is eliminated from the control loop, permitting direct control of pressure without taking into account the thermal delay.

In one example, the coolant used is pure water. Pure water has a very high latent heat of vaporization thus it absorbs a substantial amount of heat as it vaporizes. However, water boils at a temperature of 100° C. at atmospheric pressure of 14.7 psia. In order to provide suitable cooling for an electronic apparatus, coolant 16 needs to boil at a temperature in the range of approximately 50-65° C. When water is subjected to a subambient pressure of about 3 psia, its boiling temperature decreases to approximately 60° C. Thus, in the embodiment of FIG. 1A, the orifice 32 permits the coolant pressure downstream from it to be less than the coolant pressure between the pump 30 and the orifice 32.

In one example, pure water flowing from the pump 30 to the orifice 32 and 34 has a temperature of approximately 60° C. to 65° C., and a pressure in the range of approximately 15 psia to 100 psia. After passing through the orifice 32 and 34, the water will still have a temperature of approximately 60° C. to 65° C., but will have a much lower pressure, in the range about 2 psia to 4 psia. Due to this reduced pressure, some or all of the water will boil as it passes through and absorbs heat from the heat-generating structure 12, and some or all of the water will thus vaporize. After exiting through tube 24, the water vapor (and any remaining liquid water) will still have the reduced pressure of about 2 psia to 4 psia.

When this subambient water vapor reaches the heat exchanger 28, heat will be transferred from the vapor to the forced air flow 38. The air flow 38 has a temperature less than a specified maximum of 55° C., and typically has an ambient temperature below 40° C. As heat is removed from the vapor, any portion of the water which is in its vapor phase will condense, such that all of the coolant water will be in liquid form when it exits the heat exchanger 28. This liquid will have a temperature of approximately 60° C. to 65° C., and will still be at the subambient pressure of approximately 2 psia to 4 psia. This liquid coolant will then flow to the pump 30 with a tee connection prior to the expansion reservoir 40. The pump 30 will have the effect of increasing the pressure of the coolant water, to a value in the range of approximately 15 psia to 100 psia, as mentioned earlier.

It will be noted that the embodiment of FIG. 1A may operate without any refrigeration system. In the context of high-power electronic circuitry, the absence of a refrigeration system can result in a very significant reduction in the size, weight, and power consumption of the structure provided to cool the electronics system.

Figure 2:
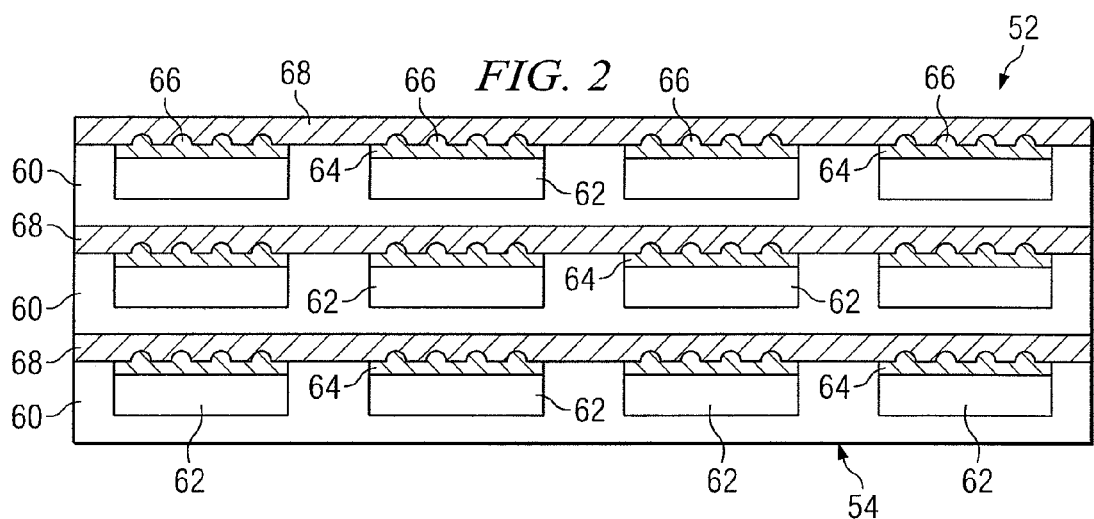
FIG. 2 is a schematic diagram of one embodiment of the heat-generating structure of FIG. 1.

FIG. 2 is a schematic diagram illustrating one example of heat-generating structure 12 that is particularly suited to cooling according to the method described in FIG. 1A. It is emphasized, however, that this is merely one example. Heat-generating structure 52 includes, in this example, a plurality of electronic modules 54 thermally coupled to a mesh 60. Mesh 60 helps transfer heat from electronic modules 54 to coolant 16 and, in some embodiments, may also provide structural support for electronic modules 54. Mesh 60 is porous such that coolant 16 may flow through mesh 16, whether heat-generating structure 52 is submerged in coolant 16 or coolant 16 flows over and through heat-generating structure 52 through mesh 60.

In this example, electronic modules 54 include electronic device 62, having associated electronic components and an interconnect component 64. Interconnect component 64 provides for electrical connection to other devices. Interconnect component 64 may include a plurality of bumps 66, which not only provide for electrical connections but also may act as pin fins, providing increased heat transfer due to the associated increased surface area contact with coolant 16. Heat-generating structure 52 may also be formed with a plurality of interconnect lines 68 electrically connecting electronic modules 54 to each other or to other devices.

In operation, heat-generating structure 52 is either submerged in coolant 16, as illustrated in FIG. 1B, or coolant 16 may be flowed over heat-generating structure 52. In either case, coolant 16 comes into contact with electronic modules 54 and mesh 60, and in response, receives heat and begins to boil, transferring heat from heat-generating structure 52 to coolant 16. Mesh 60 assists with this heat transfer, in this example, by increasing contact area with coolant 16 and conducting heat away from electronic modules 54 to coolant 16. Yet, because mesh 60 is porous, coolant 16 may flow through the mesh and allow heat-generating structure 52 to be submerged in coolant 16. It is noted that even if submerged, coolant 16 may nevertheless flow over and through heat-generating structure 52 to further increase heat transfer.

Figure 3A:
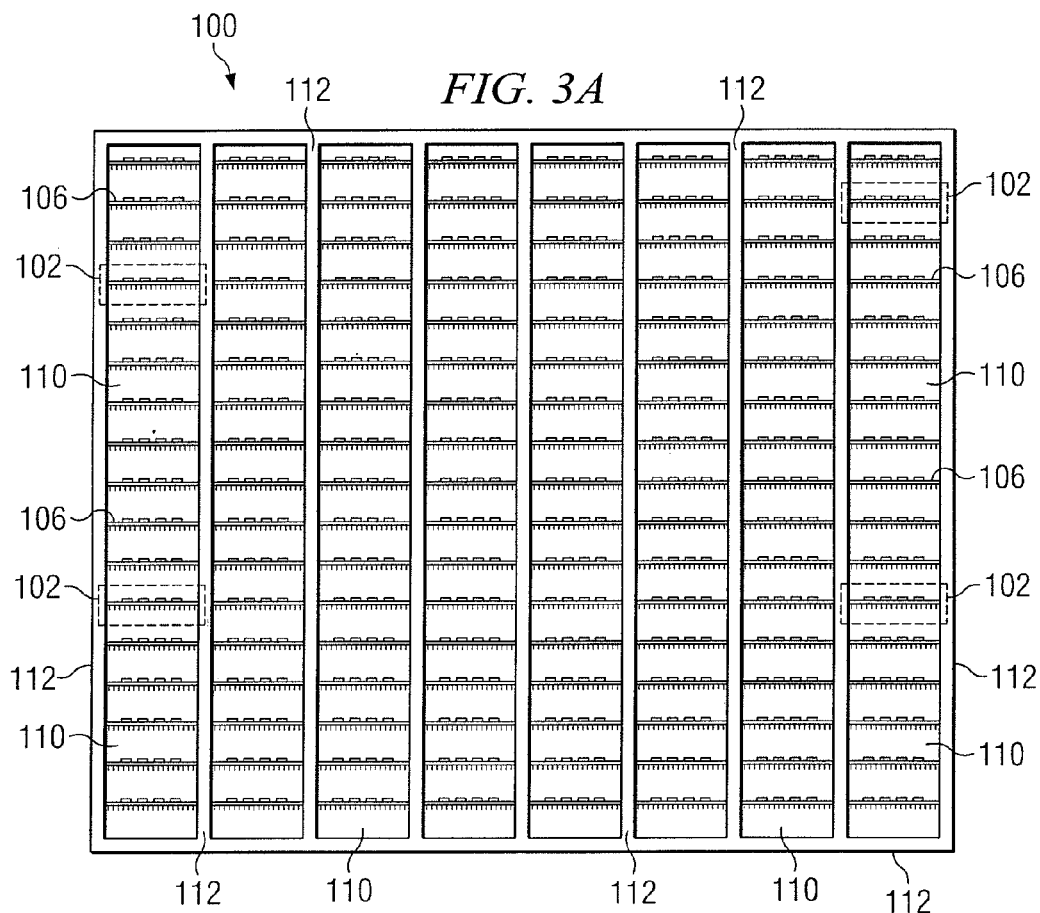
FIG. 3A is a schematic diagram of a flow-through module that includes an array of the circuit substrates of FIGS. 3B through 3D that may be cooled according to the method of FIG. 1A.
Figure 3B:
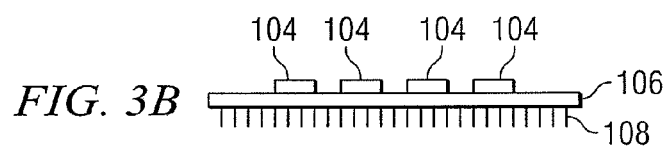
FIGS. 3B through 3C are schematic diagrams showing various views of a circuit substrate that may be cooled according to the method of FIG. 1A.
Figure 3C:
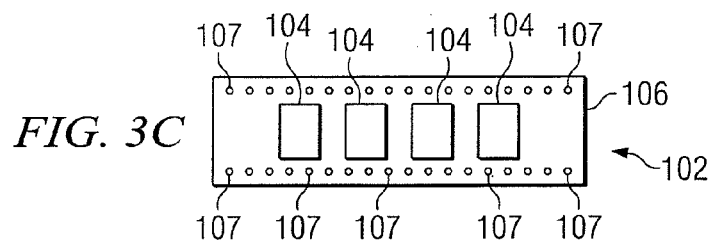
Figure 3D:
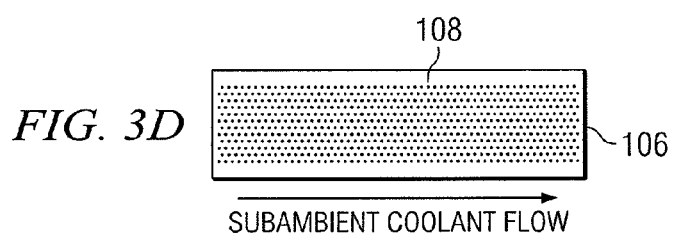

FIG. 3A illustrates a flow through module 100 that may form a part of an alternative embodiment of heat-generating structure 12. Module 100 includes a plurality of components best illustrated in FIG. 3B through 3D. FIG. 3B is a side view, FIG. 3C is a top view, and FIG. 3D is a bottom view of a circuit substrate 102 according to the teachings of the invention. FIG. 3A is taken along the direction of lines 3A-3A of FIG. 3C, but for an array of circuit substrates 102. Circuit substrate 102 includes a plurality of electronic devices 104 formed on a substrate 106. Coupled to substrate 106 are a plurality of micro pin fins 108, best illustrated in FIG. 3D. Interconnects 107 are disposed on top of substrate 106 for providing electrical connection to electronic devices 104. In one embodiment, substrate 106 is highly thermally conductive to enhance heat transfer.

Each one of circuit substrates 102 is shown positioned in an array configuration to form module 100, illustrated in FIG. 3A. Disposed between adjacent circuit substrates 102 are void spaces 110. Void spaces 110 provide a space for coolant 16 to flow or to otherwise come into contact with circuit substrates 102. A plurality of interconnect stringers 112 may separate adjacent circuit and associated substrates 102. Interconnect stringers 112 may provide suitable electrical connections, as well as structured support for circuit substrates 102, as well as thermal coupling to coolant 16 within void regions 110. Further, blank or dummy substrates may be utilized to route signals or power from one interconnect stringer 112 to another, in addition to that routed on the edges of the module 100.

In operation, coolant may flow through, or be maintained within, void regions 110, within the context of system 10, or other suitable cooling system, allowing heat transfer from circuit and associated substrate 102 to the coolant. In the illustrated embodiment, flow is into or out of the page of FIG. 3A. Micro pin fins 108 further enhance heat transfer by increasing surface area contact with the coolant. Other forms of enhancements such as fins, dimples, or microchannels can be used. Such a system may allow direct contact between the coolant and any heat generating electronics, resulting in efficient boiling heat transfer. In some embodiments, circuit substrate 102 may be encapsulated, or alternatively, electronic components within may be directly exposed to the coolant, allowing for even greater heat transfer.

Figure 4A:
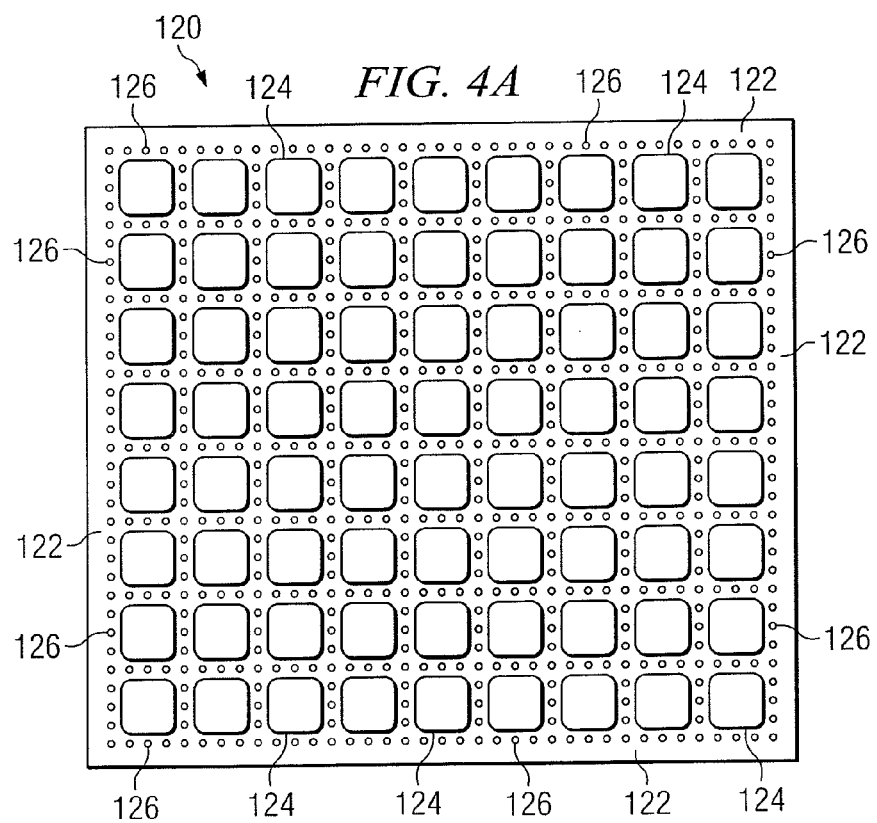
FIG. 4A is a schematic diagram of a frame for holding an array of modules of FIG. 3D.
Figure 4B:
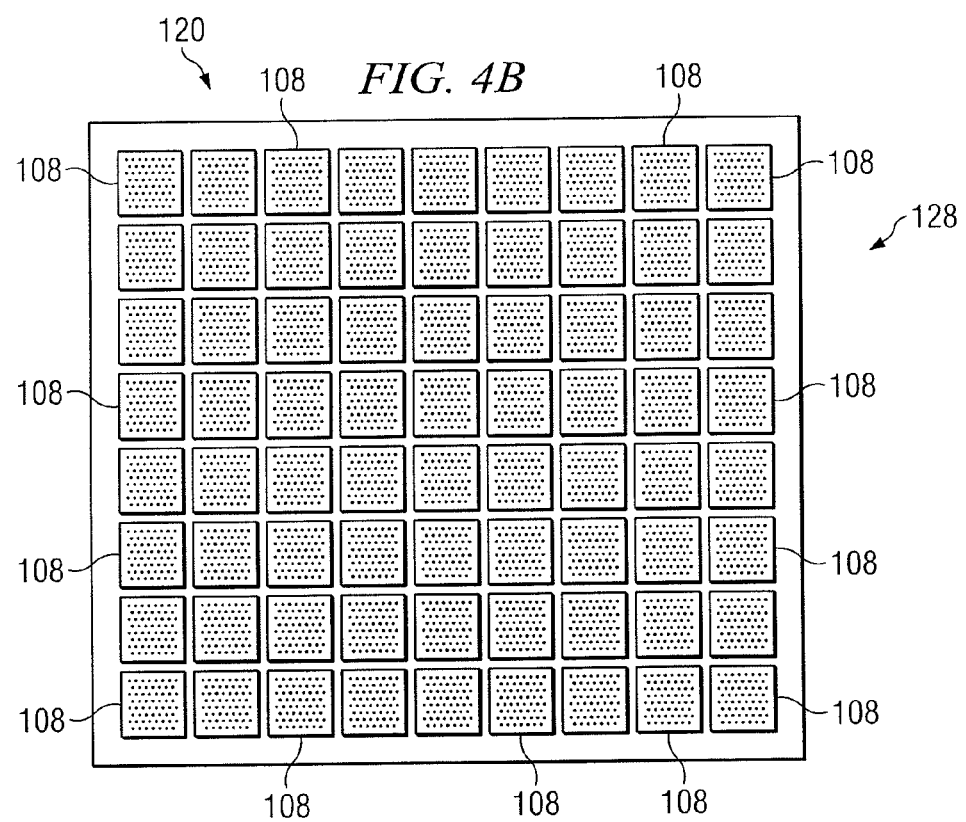
FIG. 4B is an assembly combining the frame of FIG. 4A and an array of modules of FIG. 3D that may be cooled according to the method of FIG. 1A.

FIG. 4A is a schematic diagram of a frame 120 having a frame structure 122 formed with a plurality of frame voids 124. In one embodiment, a single module 100 may be disposed in each frame void 124. Frame structure 122 may be formed with a plurality of interconnects 126, allowing electrical connection of portions of module 100 to other modules 100 or to other devices. A completed array of module 100 disposed within frame 120 is illustrated in FIG. 4B as assembly 128.

As described above with module 100, the entire assembly 128 may be submerged in coolant 16, or coolant 16 may otherwise flow through the voids within assembly 128 to provide heat transfer. It is noted that modules 100 and/or assembly 128 may have a significant depth (into the page) in some embodiments, allowing for cooling of more components. Alternatively, modules 100 and/or assembly 128 may be substantially two-dimensional.

A heat-generating structure 12 may comprise a plurality of assemblies 128 that are interconnected through a signal and power bus or a motherboard, which may include fiber optics. In one embodiment, all assemblies 128 are mounted horizontally with a forced flow of coolant 16 upward through a stack of multiple assemblies. In this case, the individual substrates are vertical, which allows the upward flowing of coolant along their lengths. In another embodiment, a water injection manifold associated with each assembly may be used to force water through each flow through module 100 mounted on frame 120.

Although the present invention has been described in detail, it should be understood that various changes, alterations, substitutions, and modifications can be made to the teachings disclosed herein without departing from the spirit and scope of the present invention which is solely defined by the appended claims.

What is claimed is:

1. A method for cooling electronics disposed in an environment having an ambient pressure, the method comprising:
   providing a coolant comprising one of pure water or pure methanol;
   bringing the electronics into direct contact with the coolant so that the coolant boils and vaporizes to thereby absorb heat from the electronics; and
   purifying the coolant while at a subambient pressure in order to maintain the purity of the coolant at a level so the coolant has an electrical resistivity greater than one million Ohms-cm.

2. The method of claim 1, wherein the coolant has an electrical resistivity greater than one million Ohms-cm.

3. The method of claim 1, further comprising:
   reducing a pressure of the coolant to a subambient pressure at which the coolant has a boiling temperature less than a temperature of the electronics.

4. The method of claim 1, wherein bringing the electronics into direct contact with the coolant comprises submerging the electronics into a bath of the coolant.

5. The method of claim 1, further comprising:
   flowing the coolant over the electronics.

6. The method of claim 1, further comprising configuring the electronics to include a plurality of electronic modules and a porous mesh coupled to each electronic module.

7. The method of claim 6, wherein each electronic module is electrically connected to at least one other of the plurality of electronic modules.

8. An apparatus for cooling electronics disposed in an environment having an ambient pressure, the apparatus comprising:
   a coolant comprising one of pure water or pure methanol;
   an assembly operable to bring the electronics into direct contact with the coolant such that heat from the electronics causes the coolant to boil and vaporize so that the coolant absorbs heat from the electronics as the coolant changes state; and
   a purification system operable to maintain the purity of the coolant at a level so the coolant has an electrical resistivity greater than one million Ohms-cm.

9. The apparatus of claim 8, wherein the coolant has an electrical resistivity greater than one million Ohms-cm.

10. The apparatus of claim 8, further comprising: a pressure reduction system operable to reduce a pressure of the coolant to a subambient pressure at which the coolant has a boiling temperature less than a temperature of the heat-generating structure.

11. The apparatus of claim 8, wherein the assembly is further operable to submerge the coolants in a bath of the coolant.

12. The apparatus of claim 8, wherein the assembly is further operable to allow the coolant to flow over the submerged electronics.

13. The apparatus of claim 8, wherein the electronics comprise a plurality of electronic modules and a porous mesh coupled to each electronic module.

14. The apparatus of claim 13, wherein each electronic module is electrically connected to at least one other of the plurality of electronic modules.

15. A method for cooling a heat-generating structure disposed in an environment having an ambient pressure, the heat-generating structure comprising electronics, the method comprising:
   reducing a pressure of a coolant to a sub ambient pressure at which the coolant has a boiling temperature less than a temperature of the heat-generating structure;
   bringing the heat-generating structure and the coolant into contact with each other at a subambient pressure, so that the coolant boils and vaporizes to thereby absorb heat from the heat-generating structure; and
   purifying the coolant in order to maintain the purity of the coolant at the level so the coolant has the electrical resistivity greater than one million Ohms-cm.

16. The method of claim 15, wherein the coolant is selected from the group consisting of pure water and pure methanol.

17. The method of claim 15, wherein the heat-generating structure includes a plurality of electronic modules and a porous mesh coupled to each electronic module.

18. The method of claim 15, wherein the heat-generating structure includes:
   a frame having a plurality of frame voids;
   a plurality of modules each disposed in respective ones of the frame voids, each module comprising an array of circuit substrates separated by void regions through which coolant may flow, each circuit substrate comprising:
      a substrate; and
      at least one electrical circuit disposed on the substrate.

19. An apparatus for cooling a heat-generating structure disposed in an environment having an ambient pressure, the apparatus comprising:
   a pressure reduction system operable to reduce a pressure of a coolant to a subambient pressure at which the coolant has a boiling temperature less than a temperature of the heat-generating structure;

a submerged assembly operable to submerge the heat-generating structure in the coolant at the subambient pressure such that heat from the heat-generating structure causes the coolant to boil and vaporize, so that the coolant absorbs heat from the heat-generating structure as the coolant changes state;

a flow loop configured to circulate the coolant to the submerged assembly; and a purification system configured to purify the coolant circulated to the submerged assembly in order to maintain the purity of the coolant at the level so the coolant has the electrical resistivity greater than one million Ohms-cm.

20. The method of claim 19, wherein the coolant is selected from the group consisting of pure water and pure methanol.

21. The method of claim 19, wherein the heat-generating structure includes a plurality of electronic modules and a porous mesh coupled to each electronic module.

22. The method of claim 19, wherein the heat-generating structure includes:

a frame having a plurality of frame voids;

a plurality of modules each disposed in respective ones of the frame voids, each module comprising an array of circuit substrates separated by void regions through which coolant may flow, each circuit substrate comprising:

a substrate; and at least one electrical circuit disposed on the substrate.

* * * * *

UNITED STATES PATENT AND TRADEMARK OFFICE
CERTIFICATE OF CORRECTION

PATENT NO. : 8,490,418 B2
APPLICATION NO. : 13/043675
DATED : July 23, 2013
INVENTOR(S) : Weber et al.

Page 1 of 1

It is certified that error appears in the above-identified patent and that said Letters Patent is hereby corrected as shown below:

In the Specification:

Column 4, line 28, delete "5-100" and insert -- 5-10% --.

Signed and Sealed this
Fifth Day of January, 2016

Michelle K. Lee
*Director of the United States Patent and Trademark Office*